(12) United States Patent
Thirugnanasambandham

(10) Patent No.: US 8,076,862 B2
(45) Date of Patent: Dec. 13, 2011

(54) DIMMER PROTECTION

(75) Inventor: Kanthimathinathan Thirugnanasambandham, Karnataka (IN)

(73) Assignee: Novar ED&S Limited, Berkshire (GB)

( * ) Notice: Subject to any disclaimer, the term of this patent is extended or adjusted under 35 U.S.C. 154(b) by 118 days.

(21) Appl. No.: 12/702,997

(22) Filed: Feb. 9, 2010

(65) Prior Publication Data

US 2010/0201273 A1 Aug. 12, 2010

(30) Foreign Application Priority Data

Feb. 9, 2009 (GB) .................................. 0902130.4

(51) Int. Cl.
*H05B 37/00* (2006.01)
*H05B 37/02* (2006.01)

(52) U.S. Cl. .................... 315/209 R; 315/127; 315/291; 315/308

(58) Field of Classification Search ............... 315/127, 315/209 R, 211, 215, 225, 226, 291, 294, 315/307, 308, 362
See application file for complete search history.

(56) References Cited

U.S. PATENT DOCUMENTS

| | | | |
|---|---|---|---|
| 4,998,045 A | 3/1991 | Ruby | |
| 5,428,265 A | 6/1995 | Booth, Jr. et al. | |
| 6,815,625 B1 | 11/2004 | Leopold et al. | |
| 7,091,672 B2 * | 8/2006 | Steffie et al. .................. | 315/282 |
| 7,098,610 B2 | 8/2006 | Rodriguez | |
| 7,190,124 B2 | 3/2007 | Kumar et al. | |
| 7,259,527 B2 | 8/2007 | Foo | |
| 7,332,683 B2 | 2/2008 | Gorman | |
| 7,339,331 B2 | 3/2008 | Vanderzon | |
| 7,446,486 B2 * | 11/2008 | Steffie et al. .................. | 315/291 |
| 7,570,031 B2 | 8/2009 | Salvestrini | |
| 7,586,718 B1 | 9/2009 | Radosavljevic et al. | |
| 7,889,526 B2 * | 2/2011 | Baby .............................. | 363/89 |
| 2009/0108765 A1 | 4/2009 | Weightman et al. | |
| 2009/0200952 A1 | 8/2009 | King | |
| 2009/0219005 A1 | 9/2009 | Salvestrini | |
| 2009/0315477 A1 | 12/2009 | Kinsella | |

(Continued)

FOREIGN PATENT DOCUMENTS

DE 10012082 10/2001

(Continued)

OTHER PUBLICATIONS

U.S. Appl. No. 12/791,712 filed Jun. 1, 2010.

*Primary Examiner* — Jacob Y Choi
*Assistant Examiner* — Jimmy Vu
(74) *Attorney, Agent, or Firm* — Seager, Tufte & Wickhem LLC

(57) ABSTRACT

A lighting installation comprises (a) a lighting load, powered by an AC power supply, said AC power supply having a cycle having a period; and (b) a dimmer comprising a first semiconductor switch operable by the action of a switching voltage to switch a current to the load on and off. In normal operation, the switch may repeatedly switch the current on and switch the current off. The average power delivered to the load is altered by altering the switching on or the switching off so that the current is on for a longer or shorter portion of the period. A method of protecting the dimmer comprises monitoring the current and, when the current exceeds a threshold value, altering the switching voltage to cause the first semiconductor switch to switch off the current.

18 Claims, 2 Drawing Sheets

U.S. PATENT DOCUMENTS

| | | |
|---|---|---|
| 2010/0060181 A1 | 3/2010 | Choi et al. |
| 2010/0141158 A1 | 6/2010 | Newman, Jr. et al. |
| 2010/0164406 A1 | 7/2010 | Kost et al. |

FOREIGN PATENT DOCUMENTS

| | | |
|---|---|---|
| EP | 1158841 | 11/2001 |
| GB | 2343796 | 5/2000 |
| GB | 2418082 | 3/2006 |
| JP | 2006032030 | 2/2006 |
| JP | 2008035632 | 2/2008 |
| WO | 03005550 | 1/2003 |
| WO | 09036517 | 3/2009 |
| WO | 09099522 | 8/2009 |

* cited by examiner

DIMMER PROTECTION

FIELD OF THE INVENTION

The present invention relates to the field of controlling current to a load. More particularly, but not exclusively, this invention relates to the field of dimmer switches for controlling the voltage supplied to a lighting load (e.g. one or more incandescent bulbs or fluorescent tubes). More particularly, but not exclusively, this invention relates to a method of protecting a lighting installation, the lighting installation comprising a dimmer comprising a semiconductor switch operable to switch on and off current to a lighting load.

BACKGROUND ART

Older designs of dimmer switches used variable resistors to control the voltage delivered across a load. A disadvantage of that approach is that energy not delivered to the load is instead converted into heat in the variable resistor, which results in the switches being inefficient and potentially dangerous.

More modern dimmers work by reducing the rms voltage across the load by switching current to the lighting load on and off many times per second. A mains AC circuit provides a voltage that varies sinusoidally from a peak positive voltage through zero voltage to a peak negative voltage. Modern dimmers work by chopping up each period of the sine wave of the AC signal into a portion in which the load is on and a portion in which it is off. One approach is to turn current to the load off whenever the AC current passes through zero current (i.e. whenever the current in the circuit reverses direction), and then to turn it back on at a voltage determined by the setting of a control knob or the like. Another approach is to turn current to the load on whenever the AC current passes through zero current, and then to turn it off at a voltage determined by the setting of a control knob or the like. In either case, the amount of energy supplied to the load increases or decreases as the load is turned on for more or less of the AC cycle; in other words, for a lighting load, the brightness of the light varies with changes in the proportion of the sine wave of the AC supply for which the light is switched on (the duty cycle).

The desired switching behaviour can be achieved for example by providing a knob-controlled variable resistor and a firing capacitor, which in combination control the semiconductor switch, with the semiconductor switch being switched when the voltage across the capacitor exceeds a threshold value, and the time taken to reach the threshold voltage being controlled by a variable resistor. Thus, for example, in some prior-art dimmers, the semiconductor switch is a triac, and the gate of the triac is connected between the firing capacitor and the variable resistor.

In order to achieve dimming by controlling the duty cycle, it is usually necessary to use a switch that is capable of switching at a frequency similar to the AC mains frequency (e.g. 50 Hz or 60 Hz). It is usual to use a semiconductor switch for that purpose. The most common choice of semiconductor switch is a triac, but it is also known to use a field effect transistor (FET), for example a metal-oxide-semiconductor FET (MOSFET). Dimmers in many lighting control systems use MOSFET switches as they have the lowest voltage drop compared with other devices such as IGBTs, thyristors and BJTs which drop around 2 V; the drop across a MOSFET is the load current multiplied by the drain-source resistance when the MOSFET is on. MOSFETs with a drain-source resistance of 50 milliohms are readily available at low prices. The power loss for a 1 KW load in such a MOSFET is less than 2.5 Watt.

Nevertheless, there is a finite voltage drop across a MOSFET switch, and as the current delivered to the light or other load flows through the switch for at least part of each cycle, the resultant power is dissipated as heat, resulting in an increase in the temperature of the switch. When the load increases beyond the rated value, the temperature of the switch can go beyond safe limits. Incorrect wiring during installation can cause a short circuit of the MOSFET load, and some loads (e.g. halogen lamps) can fail into a short-circuit mode. Consequently, in some circumstances, the MOSFETs can see a shorted load with AC mains applied across it, and the current generated during such a fault can be very large, and can easily damage the MOSFETs.

To protect the MOSFETs against excessive current due to short-circuiting of the load, it is necessary to shut down the MOSFET before the current and heat dissipation become unsafe. Prior-art designs for achieving shut-down, which typically use integrated circuits and current-sensing elements, are relatively complex and expensive.

WO03/005550A1 describes an apparatus in an electronic control system that allows two or three wire operations. Overcurrent circuitry senses when the current through MOSFETs has exceeded a predetermined current threshold, and then turns off the MOSFETs, so they do not exceed the safe operating area curve of the MOSFET. Latching circuitry is employed to keep the protection circuitry in effect even after a fault condition has been cleared. The protection circuitry output is said to be desirably configured such that it can bypass and override the normal turn off impedance and act as a lower resistance across the gates and sources of the MOSFETs. The current protection is provided by sensing a voltage across a sense resistor, and comparing the voltage generated with the base-to-emitter voltage of two transistors to initiate a current limit action. The WO03/005550A1 circuit uses an integrated circuit (IC)-based comparator, which requires a bias supply (with an attendant power requirement) and reference.

The present invention seeks to mitigate the above-mentioned problems. Alternatively or additionally, the present invention seeks to provide an improved dimmer for controlling equipment, for example lighting equipment.

SUMMARY OF THE INVENTION

The present invention provides, according to a first aspect, a dimmer for connection to a load powered by an AC power supply, said AC power supply having an AC cycle having a period, the dimmer, in an example embodiment, may include:

a first semiconductor switch having a first terminal for receiving a drive current at a drive voltage, and second and third terminals, wherein the semiconductor switch is arranged so that when the drive voltage is greater than a switching-threshold voltage, a load current is supplied through the second and third terminals from the power supply to the load, and when the drive voltage is less than said switching-threshold voltage, the first semiconductor switch switches off said load current;

wherein the dimmer is arranged to repeatedly switch the first semiconductor switch on and off in normal operation, the dimmer being operable to alter the average power delivered to the load by altering the switching on or the switching off of the first semiconductor switch so that the load current is on for a longer or shorter portion of the period of the AC cycle;

the dimmer further comprising a further semiconductor switch having a first terminal for receiving a switching current at a switching voltage, and second and third terminals, wherein the further semiconductor switch is arranged such that when the switching voltage is greater than an overload-threshold voltage, the further semiconductor switch diverts said drive current away from the first terminal of the first semiconductor switch and through the second and third terminals of the further semiconductor switch, thereby reducing the drive voltage at the first terminal of the first semiconductor switch to a voltage that is less than the switching-threshold voltage, thus causing the first semiconductor switch to switch the load current off; and wherein, the switching voltage at the first terminal of the further semiconductor switch is derived from a voltage generated by the load current, such that, when the load current exceeds a threshold value, the further semiconductor switch is switched on and the first semiconductor switch, and hence the load current, is thereby switched off.

The invention may provide an elegant approach to dealing with an excessive load current, using the voltage generated in the first semiconductor switch by the excessive load current itself to activate a further semiconductor switch that is arranged to rob away the drive current from the first semiconductor switch, thus switching off the excessive load current. In an example embodiment, described below, in which the first semiconductors switch is a MOSFET, and the further semiconductor switch is a npn-pnp pair, voltage information from the Drain of the MOSFET is used to drive a current into the base of the npn-pnp pair, and the other two terminals of the pair are connected across the Gate and Source of the MOSFET.

In contrast to the approach described in WO03/005550A1, there is no need for a comparator, and hence no need for a bias supply. Said voltage generated by the load current may be a voltage across the second and third terminals of the first semiconductor device; thus, rather than using a separate sense resistor to sense an overload current, as in WO03/005550A1, the resistance of the first semiconductor switch itself may be used to sense the load current. Not using a sense resistor also has an advantage in terms of power loss; use of a sense resistor involves additional power dissipation while use of the first semiconductor switch as a sense component does not add any extra loss. Advantageously, the sensed voltage may also be higher than that developed across a sense resistor.

When the resistance between the second and third terminals of the first semiconductor switch increases with increasing temperature, an inherent safety feature is provided: when the internal ambient temperature of the dimmer increases, the resistance seen by the flowing load current increases, which brings down the load-current threshold. Similarly, the switching threshold of the further semiconductor switch may decrease with an increase in the ambient temperature. Those two features, together or separately, may provide a reduction in the load-current threshold in circumstances when that is desirable (i.e. at high ambient temperatures).

The switching voltage and the voltage generated by the load current are voltages relative to a common reference point, which may be the third terminal of the first semiconductor switch. The switching voltage may be divided from a voltage generated by the load current, for example via a potential divider.

The first semiconductor switch and/or the further semiconductor switch may for example be a field-effect transistor (FET, e.g. a MOSFET) or a bipolar junction transistor (BJT) or an insulated gate bipolar transistor. The skilled person will understand that, in the case of for example a FET, the first terminal will be the gate and the second and third terminals will be the drain and the source, whereas in the case of for example a BJT, the first terminal will be the base and the second and third terminals will be the collector and emitter.

The further semiconductor switch may be a latched switch. The latch may remain closed until it is reset. The latched switch may comprise a pair of semiconductor switches, for example a pair of bipolar junction transistors (for example a pnp BJT and an npn BJT). The pair of semiconductor switches may be in a single package or in separate packages.

Advantageously, the switch may be less sensitive to noise than an IC based one, such as that described in WO03/005550A1. The latch may be arranged not to require any special mechanism to reset; in contrast, a comparator-based latch needs to be reset.

The dimmer may comprise a second semiconductor switch, connected in series with the first semiconductor switch. In such an arrangement, one of the first and second switches is for the positive AC half-cycle and the other is for the negative AC half-cycle. The protection against excess load current described above in relation to the first semiconductor switch is preferably also provided for the second semiconductor switch.

The dimmer may further comprise a controller, which may be a microprocessor, which may monitor the commands form user, and which may control the switching of the first semiconductor switch.

The first switch may switch the current to the load on and switch the current to the load off at least once in each cycle. The first switch may switch the current to the load on and switch the current to the load off at least once in each half cycle. The first switch may switch the current to the load off at the beginning of every half cycle. The first switch may switch the current to the load on at the beginning of every half cycle.

The switching voltage may be limited to a limiting value.

The average power delivered to the load may be altered by increasing or decreasing a delay between switching of the current to the load on/off and switching the current to the load off/on.

The load may be a lighting load.

The present invention provides, according to a second aspect, a lighting installation including a dimmer according to the first aspect of the invention.

It will of course be appreciated that features described in relation to one aspect of the present invention may be incorporated into other aspects of the present invention.

DESCRIPTION OF THE DRAWINGS

Embodiments of the present invention will now be described by way of example only with reference to the accompanying schematic drawings of which.

DETAILED DESCRIPTION

In a lighting installation according to an example embodiment of the invention, first and second semiconductor switches (one for the positive and one for the negative half cycle), in this example two series-connected MOSFETs, are protected against short circuit. Each MOSFET, as is usual, has a first, gate, terminal Q1(*i*) for receiving a drive current resulting from a drive voltage at said first terminal, a second, drain, terminal Q1(*ii*) and a third, source, terminal Q1(*iii*). When the drive voltage is greater than a switching-threshold voltage, a current is supplied from an AC power supply to a lighting load, through the drain and source terminals of the MOSFET. When the drive voltage is less than the switching-threshold voltage, the MOSFET switches off the load current. The voltage across each MOSFET is sensed during the expected ON duration, and a further semiconductor switch Q7, in this example a pair of transistors (FIG. 2), is driven to rob away the MOSFET's drive current if the load current becomes too high. The further semiconductor switch Q7 has a first terminal Q7(*i*) for receiving a switching current, a second terminal Q7(*ii*), and a third terminal Q7(*iii*). When the voltage between the MOSFET's drain and source is greater than a safe level, of around 1.6 V in this example, a switching voltage at the switch's first terminal Q7(*i*), relative to its third terminal Q7(*iii*), (which voltage is divided from the drain-source voltage) exceeds an overload-threshold voltage, and the further semiconductor switch Q7 diverts the drive current away from the gate of the MOSFET and through the second Q7(*ii*) and third Q7(*iii*) terminals of the further semiconductor switch Q7, thereby reducing the drive voltage at the drive of the MOSFET to a voltage that is less than the switching-threshold voltage. That causes the MOSFET to switch off the load current. A diode is used to block the voltage being sensed at the background of 400 V to a lower level of less than 15V. The sensing accuracy and resolution is good when the MOSFET is on, and when the MOSFET is off the sensing signal saturates at 15V. This example embodiment does not require an integrated circuit (IC) to implement the protection, and for each MOSFET uses only two very low-cost transistors, and a few diodes and resistors. The protection is highly effective, and there is no delay involved in the sensing. In contrast to prior-art designs, which typically use ICs and current sensing elements, the MOSFET on-state voltage itself may be used for protection. Thus the embodiment is an example of very low-cost short-circuit protection.

Figure 1:
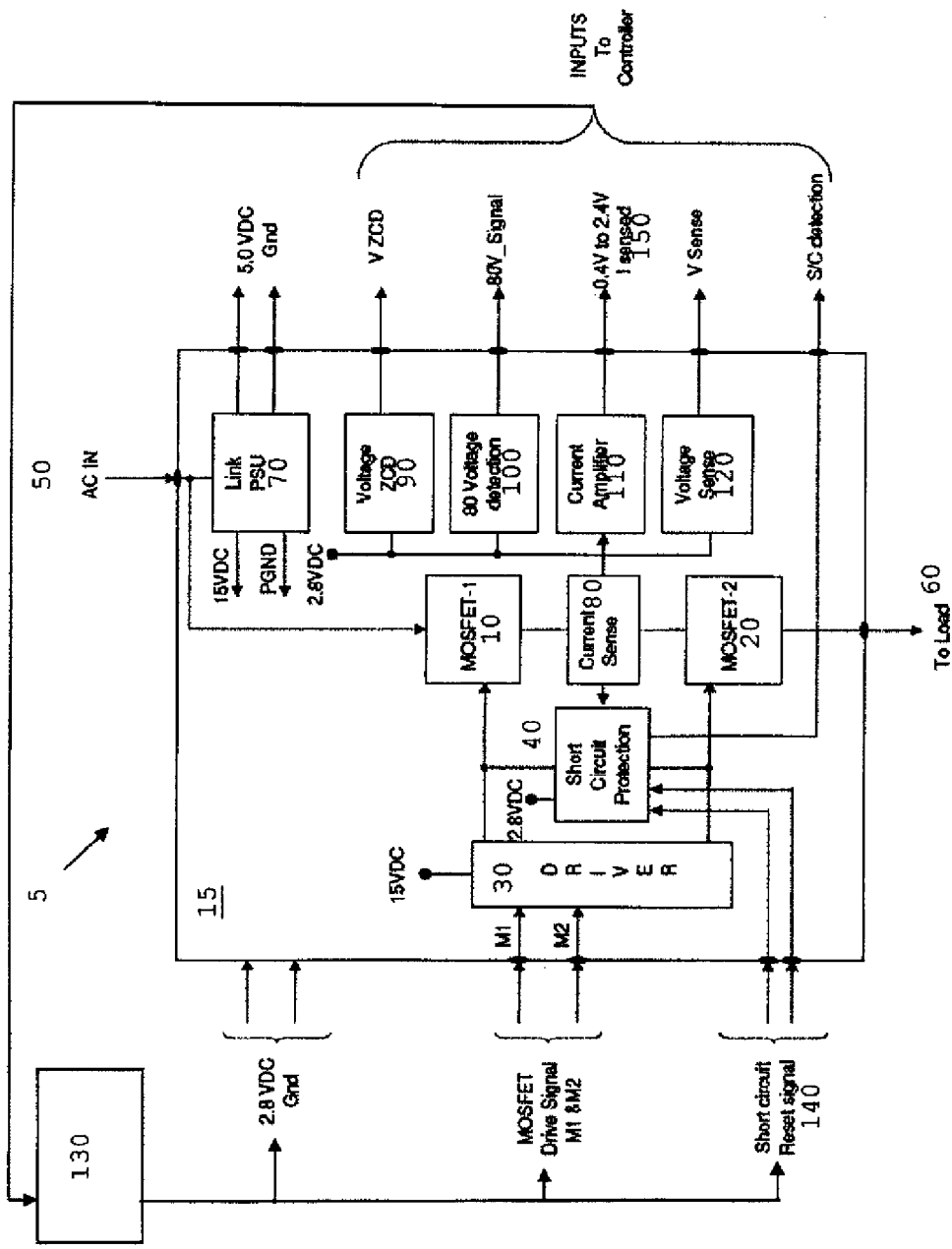
FIG. 1 is a block diagram of a dimmer from an example embodiment of a lighting installation according to the invention.

Describing the example lighting installation in more detail, the installation (FIG. 1) includes dimmer 5 including a board 15, upon which are mounted components forming a number of functional blocks.

At the heart of the dimmer 5 are two MOSFETs 10, 20, connected in series between AC IN 50 and a light (load 60) controlled by the dimmer 5; the MOSFETs 10, 20 thereby control the current supplied to the load 60. The MOSFETs 10, 20 are switched on and off by control signals from driver 30. Two MOSFETs 10, 20 are provided to enable switching in both the positive and negative halves of the cycle.

Controller 130 turns on dimmer MOSFETs 10, 20 by supplying MOSFET driving signals (M1 and M2) through MOSFET driver 30. To detect the point at which the AC cycle of the AC mains supply crosses zero, the MOSFETs are turned "OFF" for a short while just before a zero cross is expected (from a measured AC frequency).

A link power supply unit (PSU) 70 is also provided and works in a "power-stealing" mode: it includes a capacitor which is charged whilst the MOSFETs 10, 20 are off, and then the power stored in the capacitor is used to power components of the dimmer 5 whilst the MOSFETs 10, 20 are turned on. It generates two isolated outputs, a +15 V output for the MOSFET driver 30 and a +5 V for display LEDs, the controller 130 and a RF system associated with the dimmer (for sending and receiving signals from remote elements of the lighting installation).

Initially during normal operation of the dimmer 5, both MOSFETs are "OFF". A zero-cross detector (ZCD) circuit 90 senses the voltage across MOSFETs 10, 20 and if MOSFETs 10, 20 are OFF, ZCD 90 generates a square-wave pulse. With the resulting ZCD information, software running in controller 130 will determine the zero cross and the frequency of the of AC mains.

In every cycle, dimmer MOSFETs 10, 20 are turned "ON" only if the input capacitor of the link PSU 70 has charged sufficiently; a signal representing that voltage goes to the controller 130 MCU from a 80-volt detection unit 100, as an indicator of the state the power supply 70.

Figure 2:
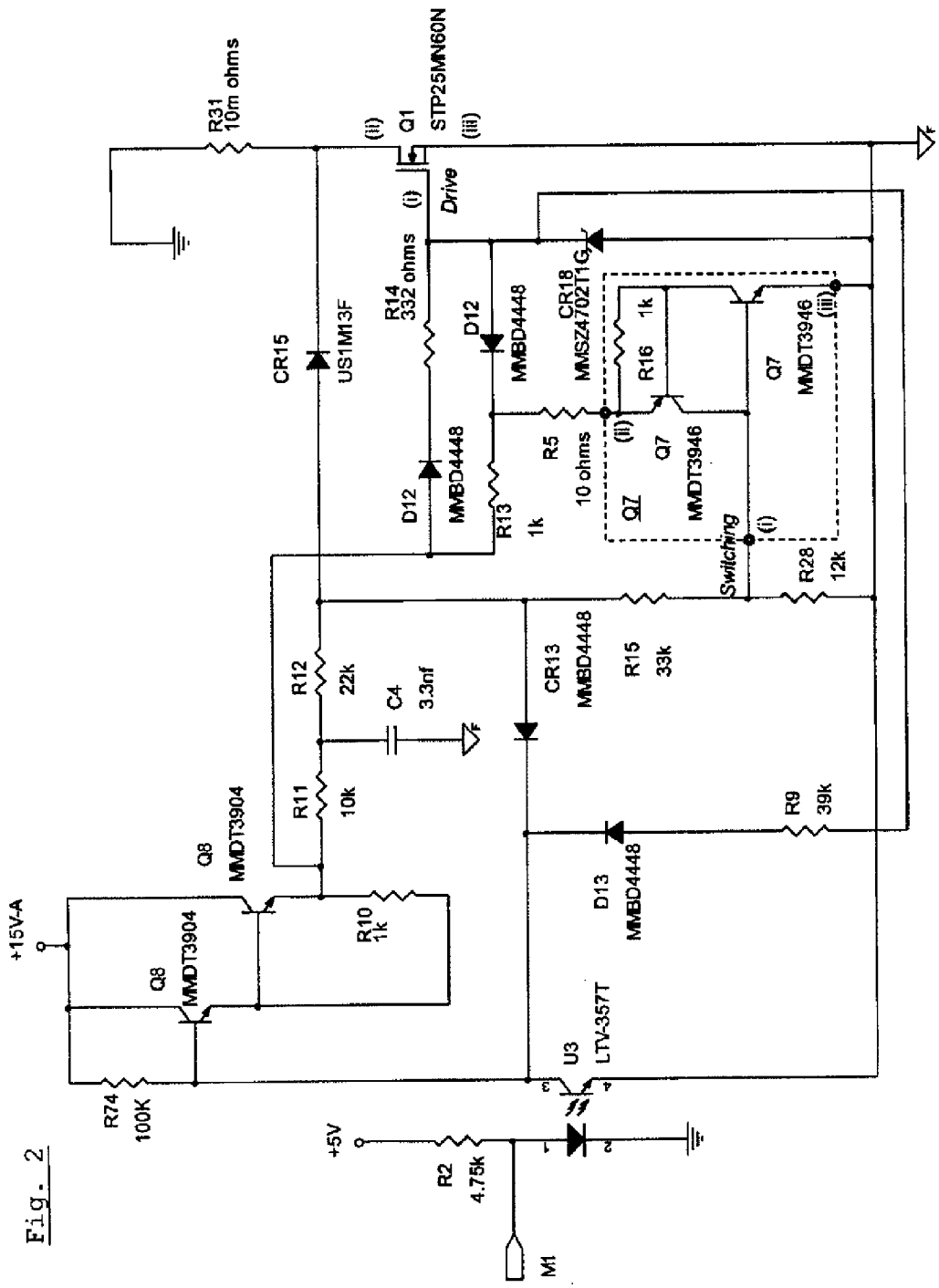
FIG. 2 shows a circuit diagram showing the driver and short-circuit protection circuitry of the dimmer of FIG. 1 in more detail.

A short-circuit protection block 40, described in more detail below with reference to FIG. 2, generates a shut down signal (active high), whenever current through the MOSFET 10, 20 (and hence through the load) exceeds approximately 13 A. The shut-down signal terminates the MOSFET driving signals coming from the output of the DRIVER 30 so that MOSFETS 10, 20 are disabled. This circuit is very fast acting one.

The protection circuit will now be explained with reference to the circuit diagram of FIG. 2, which shows in more detail the circuitry of the driver 30, short-circuit protection 40, MOSFETs 10, 20, and current sensor 80. FIG. 2 shows the components associated with MOSFET 10 (labelled Q1 in FIG. 2); the components associated with MOSFET 20 are substantially identical. As discussed above, MOSFET 10 and MOSFET 20 respectively provide switching operation in alternate halves of the AC cycle.

First, the primary function of each circuit component shown in FIG. 2 will be described.

Optocoupler U3 provides isolation and level conversion needed between (i) the MOSFETs 10 (Q1), 20 and (ii) the microcontroller 130 that controls the duty cycle of the dimmer 5; the microcontroller is referenced to Line In while the MOSFETs are driven with reference to their common sources. Resistor R2 provides bias to the LED of the optocoupler U3. When the microcontroller 130 is not connected or when its output is in the OFF state, the LED is ON and keeps the MOSFETs 10 (Q1), 20 OFF; that ensures a safe condition in the event of a failure in the interconnection or when the microcontroller 130 is in the reset state. The anode point of the LED of optocoupler U3 is controlled by the microcontroller 130 to divert the current away from the LED and thereby switch OFF the LED, and hence the opto-transistor of the optocoupler U3. R74 provides the bias for the opto transistor U3 and is chosen to be high enough to minimize the current drain when the MOSFET Q1 is OFF and low enough to ensure a reasonable rise time of the voltage at the collector of the optocoupler U3 and hence at the Gate of the MOSFET Q1.

Q8 (a pair of MMDT3904 transistors, housed in a single package) provides buffering and ensures that the voltage level and the rise time are not affected by the loading due to the resistor R11, R14 etc. R10 is provided to keep the leakage current of Q8 at low levels.

Resistor R9 controls the turn OFF time of the MOSFET. CR13 ensures that R9 does not interfere with R74 when the opto-transistor of optocoupler U3 is OFF.

R11 and R12 provide the bias voltage needed for the npn and pnp shutdown transistors Q7. The shutdown mechanism is powered only when the MOSFET Q1 is commanded to be ON. C4 introduces a delay in the availability of this bias power and provides the leading edge blanking time during which time the MOSFET Q1 turns ON. R14 limits the ON drive and D12 ensures that this resistor does not come into play during the turn OFF event.

The drain voltage of the MOSFET Q1 is sensed through CR15. When the drain voltage is less than about 7V, the voltage at the anode of CR15 is close to the drain voltage (in fact approximately 0.6 V higher). When the current through the MOSFET Q1 increases, the drain voltage and the voltage at the anode of CR15 increases until clamped to about 7V. When the MOSFET is OFF, the drain voltage can be higher than 320V, and the diode prevents this high voltage from reaching the rest of the circuitry.

R15 provides the drive signal for the npn part of the transistor Q7 when the voltage at the anode of CR15 increases (due to larger current flow through the MOSFET Q1) such that the voltage at the base-to-emitter of the npn part of Q7 exceeds its cut-in voltage of 0.6 V. R28 in conjunction with R15 and the base-to-emitter voltage of the npn part of Q7 decides the point at which the protection starts to act as decided by the equation given below:

$$I_{limit} * R_{ds} = \frac{V_{be} * (R15 + R28)}{R28} - V_d$$

Where $I_{limit}$ is the load current at which the MOSFET Q1 is switched off, $R_{ds}$ is the drain-source resistance of MOSFET Q1, $V_{be}$ is the cut-in voltage of the base and emitter of the npn part of Q7, and Vd is the voltage across the diode CR15.

Q7 houses a pnp and npn transistor in a single package and is arranged in a latch configuration. Normally this latch is OFF. When the npn part is biased to 0.6 V, its collector current starts increasing. Initially, when this current goes through R16 (which is used to limit the base to emitter voltage of pnp part of Q7 and hence its leakage current), it increases to a level that makes the voltage across it and across the base to emitter of the pnp part of Q7 to exceed 0.6 V, so the pnp part starts conducting and amplifying the current through its base. This amplified current goes back to the base of the npn part of Q7. This initiates a cumulative action and, in a very short period (of the order of a few microseconds) the latch is fully ON without any need for a current through R15.

R5 limits the shut down current and damps any parasitic oscillation that might arise due to very high current at turn OFF of the MOSFET. R13 provides the latching current needed for the Q7 latch during any oscillation at the drain and D12 blocks the current that can go to the gate through R13 at turn ON.

CR13 ensures that at normal turn OFF, initiated by the turn ON of the opto-transistor of U3, any transient signal coming through the junction capacitance of CR15 does not activate the latch through R15. This is needed to enable the MOSFET to have slow and smooth turn OFF, controlled only by R9 and not through the latch. To meet stringent conducted emission requirements, it is often mandatory to have a relatively slow and smooth turn OFF under normal load conditions, while a relatively fast turn OFF may be needed in the case of a short.

Zener diode CR18 protects the gate when there is an abrupt turn OFF by limiting the rise in voltage that might occur through the drain to gate capacitance.

In this example, for a 300 W dimmer a MOSFET with an Rds ON of 140 milli Ω at 25° C. is used, which generates a voltage in excess of 2 V for a current of 15 A; that gives good signal level, flexibility and ease of setting the over-current trip level.

Operation of the circuitry will now be described.

During normal operation (i.e. during the portion of the AC cycle for which current is delivered to the load 60, and when there is no short-circuit fault), optocoupler U3 is kept ON, with a current of about 1 mA flowing through the LED of the optocoupler, which keeps the opto-transistor of the optocoupler ON. The voltage at the base of the Darlington transistors Q8 is close to zero (around 200 mV), thus keeping it OFF. The voltages available at the gate of both the MOSFETs 10, (Q1) is zero, keeping them in the OFF state.

When the microcontroller 130 switches off current flow through the opto-LED, the opto-transistor turns OFF, the current through the resistor R74 is amplified by the two transistors of the Darlington Q8, and the MOSFET gate voltage goes up. The drive voltage from the emitter of Darlington Q8 is also applied to the anode of diode CR15, through the RC filter formed by R11 and C4 and resistor R12. For nominal loads, the MOSFETs turn ON, making the voltage at the drain very low (<200 mV) during positive cycles and around −200 mV during negative half cycles. That ensures that the voltage at the base of transistor Q7 is less than its cut-in voltage and the latch formed by transistors Q7 is OFF.

When the opto-transistor turns ON during normal operation (i.e. when MOSFET 10 (Q1) switches current from the load 60, to dim it), the gate charge is removed through R9 and CR13, the value of R9 determines the slow-down rate of the dimmer, and is tuned to ensure a balance between EMI and thermal considerations.

When the output gets excessively overloaded or short-circuited, however, the voltage at the drain with reference to the source rises to a value equal to the drain-source resistance Rds*I. (The rate of rise of that current is limited by the inductance contributed by the EMI filter and wiring.) That voltage is sensed at the anode of CR15 (with an additional 0.6 V drop). R15 and R28 potentially divide the voltage, and give a portion of it as a switching voltage to the base of the npn part of Q7. When the voltage exceeds the switching-threshold voltage of 0.6 V, the npn part of Q7 is biased ON and starts drawing an amplified collector current. This current passes through the base of the pnp transistor of Q7, which amplifies its collector current and gives it back to the base of npn part of Q7. This cumulative action quickly saturates both transistors of pair Q7, without the need for any subsequent bias current coming through R15. When Q7 turns fully ON in that way, the gate drive of the MOSFET 10 (Q1) is removed, and MOSFET 10 (Q1) quickly turns OFF, protecting itself against the excessive current. The current limit is given by the equation for $I_{limit}*R_{ds}$ given above.

For a purely resistive load, the voltage at the drain increases and would provide the necessary latching current for the pair Q7. Since in practice there will be some finite inductance, a problem might arise if a single transistor were to be used in place of the pair Q7 having a pnp and npn set which provides a latching mechanism: a certain amount of ringing would be expected at the drain, making the voltage go to negative for a short time, thereby disabling the drive for Q7, making the MOSFET turn ON again, only to be switched OFF again because of the excessive load. Though a limiting current will reached, the power dissipation under this situation can be excessive. It is for that reason that a latching mechanism is provided by the npn and pnp transistors Q7.

The latching of Q7 is released when the gate drive signal goes below about 1.2 V.

Diode CR13 clamps any voltage generated at the anode of CR15 due to its capacitance, and does not allow the transistor Q7 to come ON during normal turn-OFF operation; that ensures that, under normal load conditions, the MOSFET is not switched OFF quickly through transistor Q7, but rather is switched OFF slowly through resistor R9, to ensure low EMI.

The activation current for short-circuit protection is in this example about 15 A nominally per MOSFET 10, 20 (Q1, Q2).

That value comes down as the temperature of the MOSFET and transistor Q7 increases, improving safeguarding of the MOSFET.

Whilst the present invention has been described and illustrated with reference to particular embodiments, it will be appreciated by those of ordinary skill in the art that the invention lends itself to many different variations not specifically illustrated herein. By way of example only, certain possible variations will now be described.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

What is claimed is:

1. A dimmer for connection to a load powered by a power supply, the dimmer comprising:
    a first switch having a first terminal for receiving a drive current at a drive voltage, and second and third terminals, wherein the first switch is arranged so that when the drive voltage is greater than a switching-threshold voltage, a load current is supplied through the second and third terminals from the power supply to the load, and when the drive voltage is less than said switching-threshold voltage, the first switch switches off said load current;
    a second switch having a first terminal for receiving a switching current at a switching voltage, and second and third terminals, wherein the second switch is arranged such that when the switching voltage is greater than an overload-threshold voltage, the second switch diverts said drive current away from the first terminal of the first switch and through the second and third terminals of the second switch, thereby reducing the drive voltage at the first terminal of the first switch to a voltage that is less than the switching-threshold voltage, thus causing the first switch to switch the load current off; and
    wherein, the switching voltage at the first terminal of the second switch is derived from a voltage generated by the load current, such that, when the load current exceeds a threshold value, the second switch is switched on and the first switch, and hence the load current, is thereby switched off.

2. A dimmer according to claim 1, wherein:
    said power supply is an AC power supply having an AC cycle with a period; and
    wherein the dimmer is arranged to repeatedly switch the first switch on and off in normal operation, the dimmer being operable to alter the average power delivered to the load by altering the switching on and/or the switching off of the first switch so that the load current is on for a longer or shorter portion of the period of the AC cycle.

3. A dimmer according to claim 1, wherein said voltage generated by the load current is the voltage at the second terminal of the first switch relative to the third terminal of the first switch.

4. A dimmer according to claim 1, wherein the switching voltage for the second switch is derived from said voltage generated by the load current via a potential divider.

5. A dimmer according to claim 1, in which the first switch and/or the second switch is a field-effect transistor, a bipolar junction transistor, or an insulated gate bipolar transistor.

6. A dimmer according to claim 1, in which the second switch is a latched switch.

7. A dimmer for connection to a load powered by an AC power supply, said AC power supply having an AC cycle having a period, the dimmer comprising:
    a first semiconductor switch having a first terminal for receiving a drive current at a drive voltage, and second and third terminals, wherein the semiconductor switch is arranged so that when the drive voltage is greater than a switching-threshold voltage, a load current is supplied through the second and third terminals from the power supply to the load, and when the drive voltage is less than said switching-threshold voltage, the first semiconductor switch switches off said load current;
    wherein the dimmer is arranged to repeatedly switch the first semiconductor switch on and off in normal operation, the dimmer being operable to alter the average power delivered to the load by altering the switching on or the switching off of the first semiconductor switch so that the load current is on for a longer or shorter portion of the period of the AC cycle;
    the dimmer further comprising a further semiconductor switch having a first terminal for receiving a switching current at a switching voltage, and second and third terminals, wherein the further semiconductor switch is arranged such that when the switching voltage is greater than an overload-threshold voltage, the further semiconductor switch diverts said drive current away from the first terminal of the first semiconductor switch and through the second and third terminals of the further semiconductor switch, thereby reducing the drive voltage at the first terminal of the first semiconductor switch to a voltage that is less than the switching-threshold voltage, thus causing the first semiconductor switch to switch the load current off; and
    wherein, the switching voltage at the first terminal of the further semiconductor switch is derived from a voltage generated by the load current, such that, when the load current exceeds a threshold value, the further semiconductor switch is switched on and the first semiconductor switch, and hence the load current, is thereby switched off.

8. A dimmer according to claim 7, wherein said voltage generated by the load current is the voltage at the second terminal of the first semiconductor switch relative to the third terminal of the first semiconductor switch.

9. A dimmer according to claim 7, wherein the switching voltage for the further semiconductor switch is derived from said voltage generated by the load current via a potential divider.

10. A dimmer according to claim 7, in which the first semiconductor switch and/or the further semiconductor switch is a field-effect transistor, a bipolar junction transistor, or an insulated gate bipolar transistor.

11. A dimmer according to claim 7, in which the further semiconductor switch is a latched switch.

12. A dimmer as claimed in claim 11, in which the latched switch comprises a pair of semiconductor switches.

13. A dimmer as claimed in claim 12, in which the pair of semiconductor switches is in a single package.

14. A dimmer according to claim 7, in which the first semiconductor switch switches the load on and switches the load off at least once in each half cycle.

15. A dimmer according to claim 7, in which the switching voltage is limited to a limiting value.

16. A dimmer according to claim 7, in which the average power delivered to the load is altered by increasing or decreasing a delay between switching the current to the load on/off and switching the current to the load off/on.

17. A lighting installation including a dimmer as claimed in claim 16.

18. A dimmer according to claim 7, in which the load is a lighting load.

\* \* \* \* \*